(12) United States Patent
Qu et al.

(10) Patent No.: US 11,291,136 B2
(45) Date of Patent: Mar. 29, 2022

(54) LIQUID-COOLED COLD PLATE DEVICE

(71) Applicant: Celestica Technology Consultancy (Shanghai) Co. Ltd, Shanghai (CN)

(72) Inventors: Zhongjiang Qu, Shanghai (CN); Zeji Ge, Shanghai (CN); Yaoyin Fan, Shanghai (CN)

(73) Assignee: Celestica Technology Consultancy (Shanghai) Co. Ltd, Shanghai (CN)

( * ) Notice: Subject to any disclaimer, the term of this patent is extended or adjusted under 35 U.S.C. 154(b) by 33 days.

(21) Appl. No.: 16/871,050

(22) Filed: May 11, 2020

(65) Prior Publication Data

US 2020/0404811 A1   Dec. 24, 2020

(30) Foreign Application Priority Data

Jun. 21, 2019  (CN) .......................... 201910543292.6
Jun. 21, 2019  (CN) .......................... 201920942432.2

(51) Int. Cl.
*H05K 7/20*  (2006.01)

(52) U.S. Cl.
CPC ..... *H05K 7/20254* (2013.01); *H05K 7/20772* (2013.01)

(58) Field of Classification Search
CPC ........... H05K 7/20254; H05K 7/20772; H05K 7/20781; H05K 7/20809; H05K 7/20218; H05K 7/20509; H05K 7/20763; H05K 7/20927; H05K 7/2079; H01L 23/473
See application file for complete search history.

(56) References Cited

U.S. PATENT DOCUMENTS

| | | | | |
|---|---|---|---|---|
| 3,631,923 A | * | 1/1972 | Izeki | F28B 9/08 165/167 |
| 5,088,005 A | * | 2/1992 | Ciaccio | H05K 7/20636 165/104.33 |
| 5,763,951 A | * | 6/1998 | Hamilton | H01L 23/473 257/706 |
| 2003/0145609 A1 | * | 8/2003 | Maisotsenko | F24F 1/0059 62/121 |
| 2007/0240867 A1 | * | 10/2007 | Amano | H01L 23/473 165/168 |
| 2011/0192568 A1 | * | 8/2011 | Hsieh | H05K 7/20927 165/48.1 |
| 2016/0120071 A1 | * | 4/2016 | Shedd | H05K 7/1485 361/679.47 |
| 2019/0327859 A1 | * | 10/2019 | Iyengar | G06F 1/20 |

* cited by examiner

*Primary Examiner* — Adam B Dravininkas

(57) ABSTRACT

The present disclosure discloses a liquid-cooled cold plate device, comprising a microchannel cold plate for dissipating heat of the electronic system, at least two microchannel groups, disposed inside the microchannel cold plate; at least one liquid inlet, provided on the microchannel cold plate and used for the cooling liquid to flow in; at least one liquid outlet provided on the microchannel cold plate and used for the cooling liquid to flow out; the cooling liquid entering the liquid inlet is divided into one cooling liquid branch; the cooling liquid branch flows bidirectionally through the microchannels group. The present disclosure uses a combination of microchannel cold plates and microchannel groups, greatly improves the heat dissipation efficiency, reduces the influence of thermal cascade, thus is beneficial to the efficient heat dissipation of electronic system.

12 Claims, 3 Drawing Sheets and claims the benefit of priority
LIQUID-COOLED COLD PLATE DEVICE

CROSS REFERENCES TO RELATED APPLICATIONS

This application claims the benefit of priority to Chinese Patent Application No. CN2019105432926, filed with CNIPO on Jun. 21, 2019, and claims the benefit of priority to Chinese Patent Application No. CN2019209424322, filed with CNIPO on Jun. 21, 2019, the contents of which are incorporated herein by reference in their entireties.

TECHNICAL FIELD

The present disclosure belongs to the technical field of refrigeration, and relates to a cooling device, in particular, to a liquid-cooled cold plate device.

BACKGROUND

With the development of electronic technology and the advancement of chip technology, the volume of electronic components is getting smaller, and the amount of heat generated by unit volume is increasing. To maintain the normal working state of electronic components, an efficient heat sink is essential. At present, most servers rely on forced air cooling to dissipate the heat generated by internal components with high power consumption and high temperature. However, as the power consumption of electronic components increases, traditional forced air cooling methods have been unable to meet the heat dissipation requirements of high heat flux density servers. As a novel heat dissipation solution, liquid-cooled technology has gradually become popular in electronic systems and other applications, because of its high efficiency and economic characteristics. There are often multiple heat sources in the electronic system. The existing liquid-cooled device does not consider the thermal cascade between multiple heat sources during the heat dissipation process. On the one hand, this thermal cascade will lead to a decrease in heat dissipation efficiency; on the other hand, it will cause temperature imbalance between different electronic components, which greatly affects the overall system performance.

SUMMARY

The objective of the present disclosure provides a liquid-cooled cold plate device for solving the problem that the prior art does not consider thermal cascading.

The present disclosure provides a liquid-cooled cold plate device. The liquid-cooled cold plate device includes: a microchannel cold plate for dissipating heat of an electronic system; at least two microchannel groups, disposed inside the microchannel cold plate; at least one liquid inlet, disposed on the microchannel cold plate for the cooling liquid to flow in; at least one liquid outlet, provided on the microchannel cold plate for the cooling liquid to flow out; the cooling liquid entering the liquid inlet is divided into one the cooling liquid branch; the cooling liquid branch passes bidirectionally through the microchannel group.

In one embodiment of the present disclosure, microchannel groups are respectively disposed at corresponding positions of heat sources inside the microchannel cold plate.

In one embodiment of the present disclosure, the liquid-cooled cold plate device further includes: a cooling unit, disposed between the liquid outlet and the liquid inlet, and used for cooling the cooling liquid; a liquid outlet pipe, disposed between the liquid outlet and the cooling unit, and used for conveying the cooling liquid flowing out of the liquid outlet to the cooling unit; a liquid inlet pipe disposed between the liquid inlet and the cooling units, and used for conveying the cooling liquid cooled by the cooling unit to the liquid inlet.

The present disclosure also provides a liquid-cooled cold plate device. The liquid-cooled cold plate device includes: a microchannel cold plate for dissipating heat of an electronic system; at least two microchannel groups disposed inside the microchannel cold plate; at least one liquid inlet, provided on the microchannel cold plate, and used for cooling liquid to flow in; at least one liquid outlet, provided on the microchannel cold plate, and used for cooling liquid to flow out; the cooling liquid entering the liquid inlet is divided into at least two cooling liquid branches; the flow path of the cooling liquid branches passes through only one microchannel group; the cooling liquid branches pass through the microchannel group unidirectionally.

In one embodiment of the present disclosure, a microchannel group is respectively disposed at the positions corresponding to heat sources inside the microchannel cold plate.

In one embodiment of the present disclosure, the liquid-cooled cold plate device further includes: a cooling unit, disposed between the liquid outlet and the liquid inlet for cooling the cooling liquid; a liquid outlet pipe, disposed between the liquid outlet and the cooling unit, and used for conveying the cooling liquid flowing out of the liquid outlet to the cooling unit; a liquid inlet pipe, disposed between the liquid inlet and the cooling units, and used for conveying the cooling liquid cooled by the cooling unit to the liquid inlet.

The present disclosure further provides a liquid-cooled cold plate device. The liquid-cooled cold plate device includes: a microchannel cold plate for dissipating heat from an electronic system; at least two microchannel groups, disposed inside the microchannel cold plate, at least one liquid inlet, provided on the microchannel cold plate, and used for the cooling liquid to flow in; at least one liquid outlet, provided on the microchannel cold plate, and used for the cooling liquid to flow out; the cooling liquid entering the liquid inlet is divided into at least two cooling liquid branches; the flow path of the cooling liquid branches passes through at least one microchannel group; at least one of the cooling liquid branches passes bidirectionally through at least one microchannel group.

In one embodiment of the present disclosure, microchannel groups are respectively disposed at positions corresponding to heat sources inside the microchannel cold plate.

In one embodiment of the present disclosure, the liquid-cooled cold plate device further includes: a cooling unit, disposed between the liquid outlet and the liquid inlet for cooling the cooling liquid; a liquid outlet pipe, disposed between the liquid outlet and the cooling unit, and used for conveying the cooling liquid out of the liquid outlet to the cooling unit; a liquid inlet pipe, disposed between the liquid inlet and the cooling units, and used for conveying the cooling liquid cooled by the cooling unit to the liquid inlet.

In one embodiment of the present disclosure, the liquid-cooled cold plate device further includes: a quick connector, disposed between the liquid outlet and the liquid outlet pipes, or/and between the liquid inlet and the liquid inlet pipe.

In one embodiment of the present disclosure, the liquid inlet pipe include a liquid inlet pipe and a liquid inlet branch pipe; one end of the liquid inlet pipe is connected to the cooling unit, and the other end of the liquid inlet pipe is connected to at least one liquid inlet branch pipe; one end of the liquid inlet branch pipe is connected to the liquid inlet main pipe, and the other end of the liquid inlet branch pipe is connected to the liquid outlet.

In one embodiment of the present disclosure, the liquid outlet pipe comprises a liquid outlet main pipe and a liquid outlet branch pipe; one end of the liquid outlet pipe is connected to at least one liquid outlet branch pipe, and the other end of the liquid outlet pipe is connected to the cooling unit; one end of the liquid outlet branch pipe is connected to the liquid outlet main pipe, and the other end of the liquid outlet branch pipe is connected to the liquid inlet.

In one embodiment of the present disclosure, the liquid-cooled cold plate device is in contact with the electronic system through a thermally conductive material pad.

In one embodiment of the present disclosure, the different components of the liquid-cooled cold plate device are welded by using a copper welding technology.

In one embodiment of the present disclosure, the liquid-cooled cold plate device is fixed by a screw, and the screw uses original hole position on the electronic system.

As mentioned above, the liquid-cooled cold plate device of the present disclosure has the following beneficial effects:

The present disclosure adopts a combination of a microchannel cold plate and a microchannel group, which greatly improves the heat dissipation efficiency. The cooling liquid is divided into at least one branch of the cooling liquid inside the microchannel cold plate, and flows through the microchannels according to their respective flow paths. The influence of thermal cascades is reduced. The different parts of the liquid-cooled cold plate device are welded by using copper welding technology to reduce the risk of liquid leakage at the joints of components. The liquid-cooled cold plate device is fixed by screws, the screw may use the original hole positions on the electronic system, it is not necessary to change the layout of the original electronic system.

COMPONENT LABEL DESCRIPTION

Figure 1:
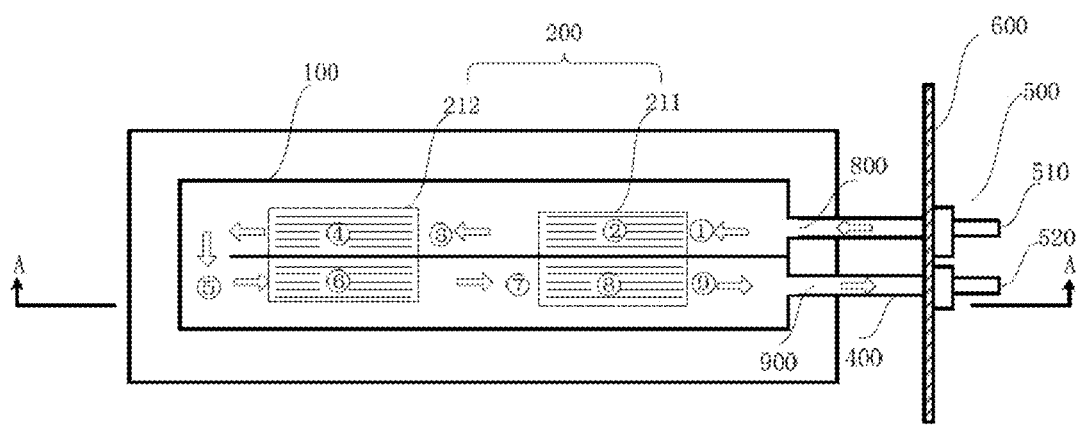
FIG. 1 is a schematic diagram of a liquid-cooled cold plate device according to one embodiment of the present disclosure.

100 Microchannel cold plate
200 Microchannel groups
211 First microchannel group
212 Second microchannel group
221 First microchannel group
222 Second microchannel group
223 Third microchannel group
224 Fourth microchannel group
225 Fifth microchannel group
231 First microchannel group
232 Second microchannel group
241 First microchannel group
242 Second microchannel group
243 Third microchannel group
251 First microchannel group
252 Second microchannel group
600 Baffle
700 Cooling liquid circulation module
710 Liquid inlet branch pipe
720 Liquid inlet main pipe
730 Cooling unit
740 Liquid outlet main pipe
750 Liquid outlet branch pipe
800 Liquid inlet
900 Liquid outlet

DETAILED DESCRIPTION OF THE PREFERRED EMBODIMENTS

The following describes the embodiments of the present disclosure through specific examples. Those skilled in the art can easily understand other advantages and effects of the present disclosure from the content disclosed in this specification. The present disclosure can also be implemented or applied through different specific implementations, and various details in this specification can also be modified or changed based on different viewpoints and applications without departing from the spirit of the present disclosure. It should be noted that, in the case of no conflict, the following embodiments and features in the embodiments can be combined with each other.

It should be noted that the diagrams provided in the following embodiments only illustrate the basic idea of the present disclosure in a schematic manner, and the diagrams only show the components related to the present disclosure, not the number, shape and size of the components in actual implementation. For drawing, the type, quantity, and proportion of each component can be changed at will during its actual implementation, and its component layout may be more complicated.

To maintain the normal working state of electronic components, an efficient heat sink is essential. In recent years, liquid cooling technology has attracted more and more attention as a novel heat dissipation solution. However, the existing liquid cooling solutions have low heat dissipation efficiency and do not consider thermal cascade, which restricts the application and development of liquid cooling technology. In view of these problems, the present disclosure proposes a liquid-cooled cold plate device. The liquid-cooled cold plate device includes a microchannel cold plate for dissipating heat from an electronic system; at least two microchannel groups disposed inside the microchannel cold plate; at least one liquid inlet on the microchannel cold plate for cooling fluid to flow in; and at least one liquid outlet on the microchannel cold plate for cooling fluid to flow out. The cooling liquid entering the liquid inlet is divided into at least one branch of the cooling fluid. If the flow path of the branch of the cooling liquid passes through only one microchannel group, the branch of the cooling liquid passes through the microchannel group unidirectionally or bidirectionally. If the flow path of the cooling liquid branch passes through at least two microchannel groups, the cooling liquid branch passes bidirectionally through the at least two microchannel groups.

The basic principle of the liquid-cooled cold plate device disclosed by the present disclosure is that the cooling liquid enters the interior of the microchannel cold plate through the liquid inlet, and then forms at least one branch of the cooling liquid flows through the microchannel group according to the internal structure of the microchannel cold plate. The microchannel cold plate contacts with a heat source in the electronic system through a thermally conductive material pad. When a cooling liquid flows through the microchannel group, the heat source exchanges heat with the cooling liquid through the thermally conductive material pad. The temperature of the cooling liquid rises after absorbing the heat generated by the heat source, and the temperature of the heat source falls because the heat is absorbed by the cooling liquid. When the cooling liquid continues to flow in the microchannel group, the heat generated by the heat source is continuously taken away, so as to lower the temperature of the heat source. In particular, for a heat source with a large area, the area of the microchannel can be appropriately increased to improve the heat dissipation effect.

In addition, in order to reduce the thermal cascade between a plurality of heat sources, the cooling liquid is divided into a plurality of cooling liquid branches and flows along their respective paths. The number of cooling liquid branches, the flow path, and the cooling liquid flow rate are determined by the internal structure of the microchannel cold plate. The cooling liquid branch can flow through all the microchannels in a microchannel group, or flow through some microchannels in the microchannel group, both of which are referred to in the present disclosure as the cooling liquid flowing through the microchannel group. The branch of the cooling liquid can flow through the microchannel group unidirectionally, which is called one-way passing. The cooling liquid can also flow through part of the microchannels in the microchannel group, and then flow through part of the microchannels in the microchannel group again, which is called bidirectional passing.

In the present disclosure, the number of the cooling liquid branch, the flow path, and the cooling liquid flow rate can be defined by optimizing the internal structure of the microchannel cold plate, thereby enhancing heat dissipation and reducing thermal cascade.

In one embodiment of the present disclosure, the cooling liquid is divided into one branch of the cooling liquid; the branch of the cooling liquid passes bidirectionally through the microchannel group.

For details, please refer to FIG. 1, which shows a diagram of the liquid-cooled cold plate device according to the embodiment of the present disclosure.

Figure 2:
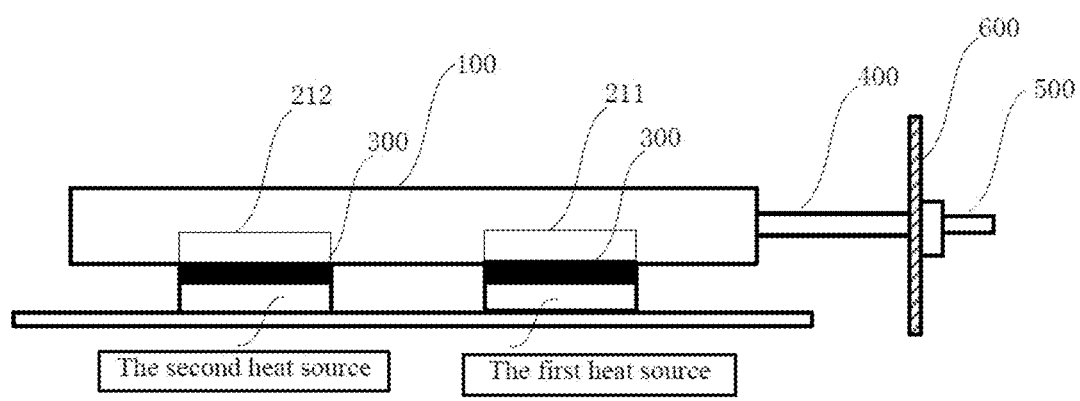
FIG. 2 is a sectional view along line A-A in FIG. 1.

In the present embodiment, the liquid-cooled cold plate device includes: a microchannel cold plate 100, a liquid inlet 800, a liquid outlet 900, and microchannel groups 200 (including a first microchannel group 211 and a first microchannel group 212), a connection copper pipe 400, a baffle 600, and a quick connector 500 (including the quick liquid inlet connector 510 and the quick liquid outlet connector 520). FIG. 2 is a cross-sectional view taken along the line A-A in FIG. 1. It can be seen in conjunction with FIG. 1 and FIG. 2 that the microchannel cold plate is in contact with a heat source through a thermally conductive material pad 300, and the microchannel group are disposed in positions corresponding to the heat sources inside the microchannel cold plate, respectively.

In the present embodiment, the cooling liquid is divided into one branch of cooling liquid (that is, no split flow), and the cooling liquid passes through the microchannel group bidirectionally.

In the present embodiment, each of the microchannel groups includes a forward microchannel and a reverse microchannel. Preferably, the number of the forward microchannels and the reverse microchannels are the same.

In the present embodiment, the cooling liquid flows in the direction indicated by the arrow in FIG. 1, and the specific flow path is as follows:

1) the cooling liquid enters the connection copper pipe 400 from the quick inlet connector 510, then flows through the liquid inlet 800 and enters the microchannel cold plate 100; then it is divided into a cooling liquid branch stream. The cooling liquid branch stream first flows through the forward microchannel of the first microchannel group 211;

2) the branch of the cooling liquid flows out from the forward microchannel of the first microchannel group 211 and flows to the second microchannel group 212;

3) the branch stream of cooling fluid flows into the forward microchannel of the second microchannel group 212, then flows out of the forward microchannel of the second microchannel group 212, and then flows into the reverse microchannel of the second microchannel group 212;

4) the branch of the cooling liquid flows out from the reverse microchannel of the second microchannel group 212 and flows to the first microchannel group 211;

5) the branch of the cooling liquid flows into the reverse microchannel of the first microchannel group 211, and then flows out of the reverse microchannel of the first microchannel group 211; and then flows through the liquid outlet 900, the connection copper pipe 400 and the quick liquid outlet connector 520 in sequence, and flows out through the liquid-cooled cold plate device.

In the present embodiment, when the temperature of the cooling liquid in the first microchannel group 211 is lower than the temperature of the first heat source, the temperature of the first heat source decreases due to heat exchange. When the temperature of the cooling liquid in the second microchannel group 212 is lower than the temperature of the second heat source, the temperature of the second heat source decreases due to the heat exchange. Therefore, as long as the temperature of the cooling liquid in the microchannel group is lower than the temperature of the corresponding heat source, the liquid-cooled cold plate device can effectively reduce the temperature of the heat source to achieve heat dissipation.

In the present embodiment, since the cooling liquid absorbs heat at ②, ④, ⑥, and ⑧, the temperature of the cooling liquid will rise; because the cooling liquid has its own heat dissipation at ③, ⑤, ⑦, and ⑨, so the temperature of the cooling liquid will decrease. Therefore, the relations of the temperature of the cooling liquid at different positions inside the liquid-cooled cold plate device is:

The temperature at ① is lower than the temperature at ②;

The temperature at ② is higher than the temperature at ③;

The temperature at ③ is lower than the temperature at ④;

The temperature at ④ is higher than the temperature at ⑤;

The temperature at ⑤ is lower than the temperature at ⑥;

The temperature at ⑥ is higher than the temperature at ⑦;

The temperature at ⑦ is lower than the temperature at ⑧;

The temperature at ⑧ is higher than the temperature at ⑨.

The temperature of the first heat source depends on the cooling liquid temperature at ② and ⑧, and the temperature of the second heat source depends on the cooling liquid temperature at ④ and ⑥. Because the temperature at ② is lower than the temperature at ④, and the temperature at ⑥ is lower than the temperature at ⑧, the temperature of the first heat source is close to the temperature of the second heat source. Specifically, when the power of the first heat source and the second heat source are equal, and the number of forward microchannels and the number of reverse microchannels in the first microchannel group 211 and the second microchannel group 212 are the same, the temperature of the first heat source is the same as the temperature of the second heat source, the thermal cascade is minimal. Therefore, the liquid-cooled cold plate device of the present disclosure can effectively reduce the temperature difference between different heat sources, thereby reducing the influence of thermal cascade.

In one embodiment of the present disclosure, the cooling liquid is divided into at least two cooling liquid branches; each of the cooling liquid branch passes through one microchannel group unidirectionally.

Figure 3:
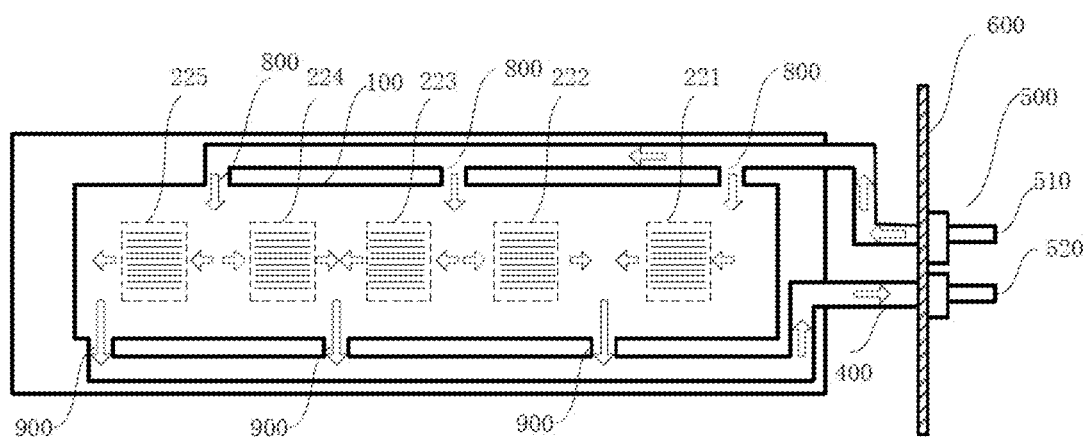
FIG. 3 is a schematic diagram of a liquid-cooled cold plate device according to another embodiment of the present disclosure.

For details, referring to FIG. 3, which shows a schematic diagram of the liquid-cooled cold plate device of the present disclosure in a second embodiment.

In the present embodiment, the liquid-cooled cold plate device includes: a microchannel cold plate 100, three liquid inlets 800, three liquid outlets 900, microchannel groups (including a first microchannel group 221, a second microchannel channel group 222, a third microchannel group 223, a fourth microchannel group 224, and a fifth microchannel group 225), a connection copper pipe 400, a baffle 600, a quick connector 500 (including quick liquid inlet connector 510 and quick liquid outlet connector 520), the microchannel cold plate is in contact with the heat source through a heat-conducting material pad, and microchannel groups are respectively provided at positions corresponding to the heat source inside the microchannel cold plate.

In the present embodiment, the cooling liquid is divided into five cooling liquid branches, and each of the cooling liquid branches passes through one of the microchannel groups unidirectionally.

In the present embodiment, each microchannel group includes only forward microchannels. Preferably, the number of forward microchannels is the number of microchannels included in the entire microchannel group.

In the present embodiment, the cooling liquid flows in the direction indicated by the arrow in FIG. 3.

The cooling liquid flows through the rapid liquid inlet connector 510, the connection copper pipe 400, and the liquid inlet 800 in sequence and enters the microchannel cold plate 100; then the cooling liquid is divided into five branches of the cooling liquid.

One of the branches of the cooling liquid flows through the first microchannel group 221 and flows out of the liquid outlet 900, and then flows through the connection copper pipe 400 and the quick liquid outlet connector 520, and flows out of the liquid-cooled cold plate device.

One of the branches of the cooling liquid flows through the second microchannel group 222 and flows out of the liquid outlet 900, and then flows through the connection copper pipe 400 and the quick liquid outlet connector 520 and flows out of the liquid-cooled cold plate device.

One of the branches of the cooling liquid flows through the third microchannel group 223 and flows out of the liquid outlet 900, and then flows through the connection copper pipe 400 and the quick liquid outlet connector 520 and flows out of the liquid-cooled cold plate device.

One of the branches of the cooling liquid flows through the fourth microchannel group 224 and flows out of the liquid outlet 900, and then flows through the connection copper pipe 400 and the quick liquid outlet connector 520, and flows out of the liquid-cooled cold plate device.

One of the branches of the cooling liquid flows through the fifth microchannel group 225 and flows out of the liquid outlet 900, and then flows through the connection copper pipe 400 and the quick liquid outlet connector 520, and flows out of the liquid-cooled cold plate device.

In one embodiment of the present disclosure, the cooling liquid is divided into at least two cooling liquid branches. The flow path of the cooling liquid branch flows through at least one microchannel group; at least one cooling liquid branch flows bidirectionally through at least one microchannel group.

Figure 4:
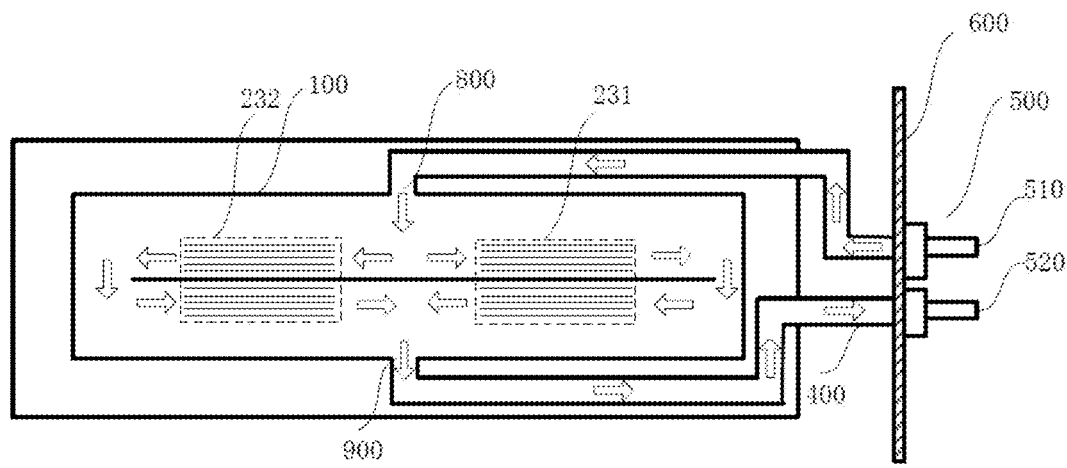
FIG. 4 is a schematic diagram of a liquid-cooled cold plate device according to another embodiment of the present disclosure.

Please referring to FIG. 4 for a schematic diagram of the liquid-cooled cold plate device of the present disclosure in a third embodiment.

In the present embodiment, the liquid-cooled cold plate device includes: a microchannel cold plate 100, a liquid inlet 800, a liquid outlet 900, and microchannel groups (including a first microchannel group 231 and a second microchannel group 232), a connection copper pipe 400, a baffle 600, and a quick connector 500 (including the quick liquid inlet connector 510 and the quick liquid outlet connector 520), and the microchannel cold plate is in contact with the heat source through a thermally conductive material pad.

In the present embodiment, the cooling liquid is divided into two cooling liquid branch, and the cooling liquid branch passes through the microchannel group bidirectionally.

In the present embodiment, each microchannel group includes a forward microchannel and a reverse microchannel. Preferably, the number of the forward microchannels and the number of the reverse microchannels are the same.

In the present embodiment, the cooling liquid flows in the direction indicated by the arrow in FIG. 4.

The cooling liquid flows through the rapid liquid inlet connector 510, the connection copper pipe 400, and the liquid inlet 800 in sequence and enters the microchannel cold plate 100; then the cooling liquid is divided into two branches of the cooling liquid.

One of the branches of the cooling liquid flows through the forward microchannels in the first microchannel group 231, then flows out of the forward microchannels in the first microchannel group 231 and flows into the reverse microchannel of the first microchannel group 231, then flows out of the reverse microchannel of the first microchannel group 231, and flows through the connection copper pipe 400 and the quick liquid outlet connector 520 in sequence after flowing out the liquid outlet 900, and finally flows out of the liquid-cooled cold plate device.

The other branch of the cooling liquid flows through the forward microchannels of the second microchannel group 232, then flows out of the forward microchannels of the second microchannel group 232 and flows into the reverse microchannel of the second microchannel group 232, then flows out of the reverse microchannel of the second microchannel group 232, and then flows through the connection copper pipe 400 and the quick liquid outlet connector 520 in sequence after flowing out the liquid outlet 900, and finally flows out of the liquid-cooled cold plate device.

In one embodiment of the present disclosure, the cooling liquid is divided into at least two cooling liquid branches. At least one of the cooling liquid branches passes bidirectionally through at least one microchannel group, and at least one of the cooling liquid branches passes through one microchannel group unidirectionally.

Figure 5:
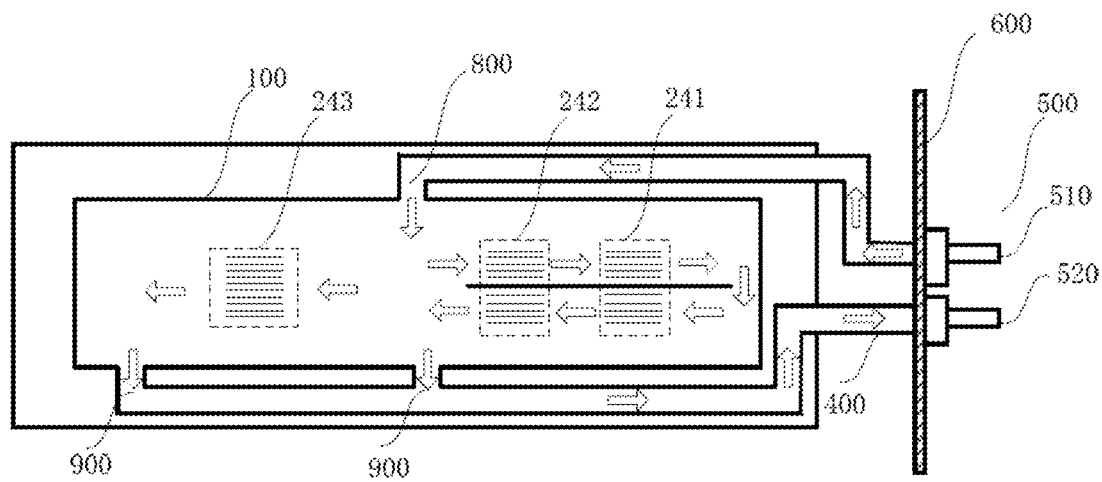
FIG. 5 is a schematic diagram of a liquid-cooled cold plate device according to another embodiment of the present disclosure.

Please referring to FIG. 5, which shows a schematic diagram of a liquid-cooled cold plate device according to a fourth embodiment.

In the present embodiment, the liquid-cooled cold plate device includes: a microchannel cold plate 100, a liquid inlet 800, two liquid outlets 900, microchannel groups (including a first microchannel group 241, a second microchannel group 242 and a third microchannel group 243), a connection copper pipe 400, a baffle 600, a quick connector 500 (including quick liquid inlet connector 510 and quick liquid outlet connector 520), the microchannel cold plate is contacted with a heat source through a thermally conductive material pad.

In the present embodiment, the cooling liquid is divided into two cooling liquid branches, one cooling liquid branch passes bidirectionally through the second microchannel group 242 and the first microchannel group 241, and the other cooling liquid branch flows directly through the third microchannel group 243.

In the present embodiment, the first microchannel group 241 includes a forward microchannel and a reverse microchannel. Preferably, the number of the forward microchannels and the reverse microchannels are the same. The second microchannel group 242 includes a forward microchannel and a reverse microchannel. Preferably, the number of the forward microchannels and the reverse microchannels are the same. The third microchannel group 243 only includes forward microchannels. Preferably, the number of forward microchannels is the number of microchannels included in the entire microchannel group.

In the present embodiment, the cooling liquid flows in the direction indicated by the arrow in FIG. 5.

The cooling liquid flows through the rapid liquid inlet connector 510, the connection copper pipe 400, and the liquid inlet 800 in sequence and enters the microchannel cold plate 100; then the cooling liquid is divided into two branches of the cooling liquid.

One of branches of the cooling liquid passes through the forward microchannels in the second microchannel group 242, then passes through the forward microchannels in the first microchannel group 241, and then passes through the reverse microchannels of the first microchannel in group 241, then passes through the reverse microchannels in the second microchannel group 242, and passes through the connection copper pipe 400 and the quick outlet connector 520 in sequence after passing through the liquid outlet 900, and finally flows out of the liquid-cooled cold plate device.

The other branch of the cooling liquid passes through the third microchannel group 243 unidirectionally, and then passes through the connection copper pipe 400 and the quick liquid outlet connector 520 after passing through the liquid outlet 900, and finally flows out of the liquid-cooled cold plate device.

Figure 6:
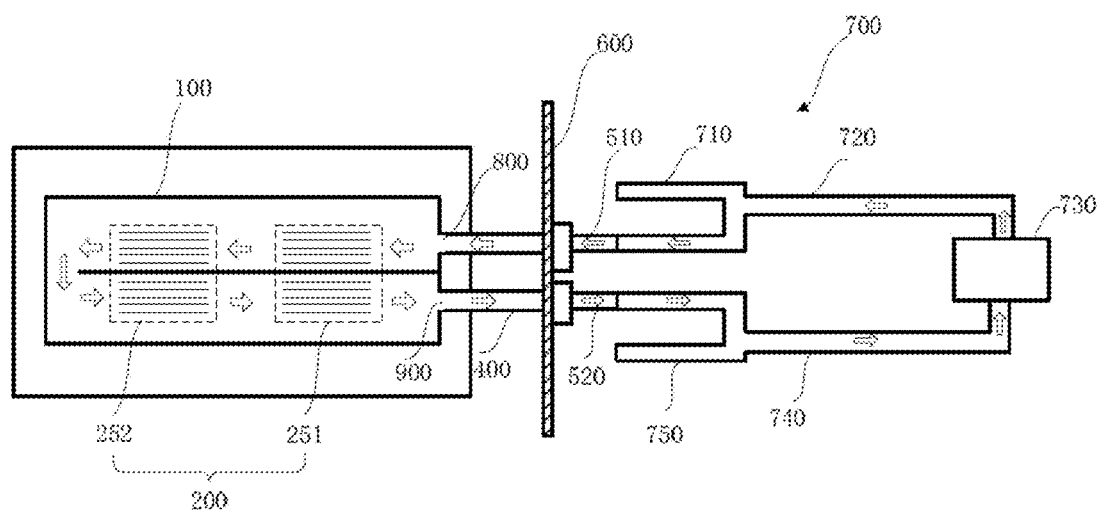
FIG. 6 is a schematic diagram of a liquid-cooled cold plate device according to another embodiment of the present disclosure.

Please referring to FIG. 6, which is a schematic diagram showing the liquid-cooled cold plate device according to a fifth embodiment of the present disclosure.

In the present embodiment, the liquid-cooled cold plate device includes: a microchannel cold plate 100, a liquid inlet 800, a liquid outlet 900, microchannel groups 200 (including a first microchannel group 251 and a second microchannel group 252), a connection copper pipe 400, a baffle 600, a quick connector 500 (including quick liquid inlet connector 510 and quick liquid outlet connector 520), a cooling liquid circulation module 700 (including a liquid inlet branch pipe 710, a liquid inlet main pipe 720, a cooling unit 730, an outlet main pipe 740 and a outlet branch pipe 750). The microchannel cold plate is in contact with a heat source through a thermally conductive material pad.

In the present embodiment, the cooling liquid is divided into one branch of cooling liquid (that is, no split flow), and the cooling liquid passes through the microchannel group bidirectionally.

In the present embodiment, each microchannel group includes a forward microchannel and a reverse microchannel. Preferably, the number of the forward microchannels and the number of the reverse microchannels are the same.

In the present embodiment, the cooling liquid flows in the direction indicated by the arrow in FIG. 6, and the specific flow path is as follows.

The cooling liquid passes through the rapid liquid inlet connector 510, the connection copper pipe 400, and the liquid inlet 800 in sequence, and enters the microchannel cold plate 100; then the cooling liquid is divided into one branch of the cooling liquid (that is, no split flow);

The cooling liquid branch flows in sequence through the forward microchannel of the first microchannel group 251, the forward microchannel of the second microchannel group 252, the reverse microchannel of the second microchannel group 252 and the reverse microchannel of the first microchannel group 251.

After passing through the liquid outlet 900, the branch of the cooling liquid flows through the connection copper pipe 400, the fast liquid outlet connector 520 in sequence, flows into the outlet branch pipe 750 in the cooling liquid circulation module 700, and then the cooling liquid in at least one of the outlet branch pipes 750 converges in the liquid outlet pipe 740 and flows into the cooling unit 730. The cooling liquid flows into the liquid inlet main pipe 720 after cooling down in the cooling unit 730, then is divided and flows into the at least one the liquid inlets branch pipe 720. The cooling liquid flows out of the cooling liquid circulation module 700, enters the rapid liquid inlet connector 510, flows through the connection copper pipe 400, and the liquid inlet 800, enters the microchannel cold plate 100, and continues to participate in the heat dissipation and cooling process for the heat source. The present embodiment achieves the recycling of the cooling liquid.

The liquid-cooled cold plate device according to the present disclosure includes, but is not limited to, the structures of the liquid-cooled cold plate device listed in the above embodiments. Any existing structural deformations and replacements made according to the principles of the present disclosure are included in the present disclosure within the scope of protection.

The disclosure adopts a combination of a microchannel cold plate and a microchannel group, which greatly improves the heat dissipation efficiency. The cooling liquid is divided into at least one branch of the cooling liquid inside the microchannel cold plate, and flows through the microchannels according to their respective flow paths. The influence of thermal cascades is reduced. The different parts of the liquid-cooled cold plate device are welded by using copper welding technology to reduce the risk of liquid leakage at the joints of components. The liquid-cooled cold plate device is fixed by screws, the screw may use the original hole positions on the electronic system, it is not necessary to change the layout of the original electronic system. In addition, the present disclosure adopts an indirect liquid cooling method, the cooling liquid is separated from the heat-dissipating object, and the heat generated by the electronic device is transferred to the cooling liquid through the liquid cooled plate or other heat transfer components. The present disclosure does not have high requirement for the cooling media, does not have to change the original electronic system, and the cost and difficulty for maintenance are low. Therefore, the present disclosure effectively overcomes various shortcomings in the prior art, and has high industrial utilization value.

The above-mentioned embodiments merely illustrate the principle of the present disclosure and its effects, but are not intended to limit the present disclosure. Anyone familiar with this technology can modify or change the above embodiments without departing from the spirit and scope of the present disclosure. Therefore, all equivalent modifications or changes made by those with ordinary knowledge in the technical field to which they belong without departing from the spirit and technical ideas disclosed by the present disclosure should still be covered by the claims of the present disclosure.

The invention claimed is:

1. A liquid-cooled cold plate device, comprising:
   a microchannel cold plate for dissipating heat of an electronic system;
   at least two microchannel groups, disposed inside the microchannel cold plate;
   at least one liquid inlet, provided on the microchannel cold plate, and used for cooling liquid to flow in; and
   at least one liquid outlet, provided on the microchannel cold plate, and used for the cooling liquid to flow out;
   wherein the cooling liquid entering the liquid inlet is divided into one cooling liquid branch;
   at least one of the microchannel groups comprises forward microchannels and reverse microchannels adjacent to the forward microchannels, and the cooling liquid branch first flows through the forward microchannels of the microchannel group and subsequently flows through the reverse microchannels of the same microchannel group.

2. The liquid-cooled cold plate device according to claim 1, wherein microchannel groups are respectively disposed at positions corresponding to heat sources inside the microchannel cold plate.

3. The liquid-cooled cold plate device according to claim 1, wherein the liquid-cooled cold plate device further comprises:
   a cooling unit, disposed between the liquid outlet and the liquid inlet, and used for cooling the cooling liquid;
   a liquid outlet pipe, disposed between the liquid outlet and the cooling unit, and used for conveying the cooling liquid flowing out of the liquid outlet to the cooling unit;
   a liquid inlet pipe, disposed between the liquid inlet and the cooling unit, and used for conveying the cooling liquid cooled by the cooling unit to the liquid inlet.

4. A liquid-cooled cold plate device, wherein the liquid-cooled cold plate device comprises:
   a microchannel cold plate for dissipating heat of an electronic system;
   at least two microchannel groups, disposed inside the microchannel cold plate;
   at least one liquid inlet, provided on the microchannel cold plate, and used for cooling liquid to flow in;
   at least one liquid outlet, provided on the microchannel cold plate, and used for the cooling liquid to flow out;
   wherein the cooling liquid entering the liquid inlet is divided into at least two cooling liquid branches;
   wherein at least one of the microchannel groups comprises forward microchannels and reverse microchannels adjacent to the forward microchannels, and at least one of the cooling liquid branches first flows through the forward microchannels of the microchannel group and subsequently flows through the reverse microchannels of the same microchannel group.

5. The liquid-cooled cold plate device according to claim 4, wherein microchannel groups are respectively disposed at positions corresponding to heat sources inside the microchannel cold plate.

6. The liquid-cooled cold plate device according to claim 4, wherein the liquid-cooled cold plate device further comprises:
   a cooling unit, disposed between the liquid outlet and the liquid inlet, used for cooling the cooling liquid;
   a liquid outlet pipe, disposed between the liquid outlet and the cooling unit, and used for conveying the cooling liquid flowing out of the liquid outlet to the cooling unit;
   a liquid inlet pipe, disposed between the liquid inlet and the cooling unit, and used for conveying the cooling liquid cooled by the cooling unit to the liquid inlet.

7. The liquid-cooled cold plate device according to claim 6, wherein the liquid-cooled cold plate device further comprises:
   a quick connector, disposed between the liquid outlet and the liquid outlet pipe, or/and between the liquid inlet and the liquid inlet pipe.

8. The liquid-cooled cold plate device according to claim 6, wherein the liquid inlet pipe comprises a liquid inlet main pipe and a liquid inlet branch pipe; one end of the liquid inlet pipe is connected to the cooling unit, and the other end of the liquid inlet pipe is connected to at least one liquid inlet branch pipe; one end of the liquid inlet branch pipe is connected to the liquid inlet main pipe, and the other end of the liquid inlet branch pipe is connected to the liquid inlet.

9. The liquid-cooled cold plate device according to claim 6, wherein the liquid outlet pipe comprises a liquid outlet main pipe and a liquid outlet branch pipe; one end of the liquid outlet pipe is connected to at least one liquid outlet branch pipe, and the other end of the liquid outlet pipe is connected to the cooling unit; one end of the liquid outlet branch pipe is connected to the liquid outlet main pipe, and the other end of the liquid outlet branch pipe is connected to the liquid outlet.

10. The liquid-cooled cold plate device according to claim 4, wherein the liquid-cooled cold plate device is in contact with the electronic system through a thermally conductive material pad.

11. The liquid-cooled cold plate device according to claim 4, wherein different parts of the liquid-cooled cold plate device are welded by using a copper welding technology.

12. The liquid-cooled cold plate device according to claim 4, wherein the liquid-cooled cold plate device is fixed by a screw, and the screw uses original hole position on the electronic system.

* * * * *